(12) United States Patent
Kozu

(10) Patent No.: US 6,724,270 B2
(45) Date of Patent: Apr. 20, 2004

(54) OSCILLATION CIRCUIT OF CASCODE CONNECTION TYPE

(75) Inventor: Toru Kozu, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 75 days.

(21) Appl. No.: 10/025,688

(22) Filed: Dec. 26, 2001

(65) Prior Publication Data

US 2002/0079978 A1 Jun. 27, 2002

(30) Foreign Application Priority Data

Dec. 27, 2000 (JP) .................................... 2000-399217

(51) Int. Cl.[7] .................................................. H03B 5/12
(52) U.S. Cl. .................................... 331/117 R; 330/311
(58) Field of Search .............................. 331/108 R, 114, 331/117 R; 330/311; 332/135

(56) References Cited

U.S. PATENT DOCUMENTS 5,245,298 A * 9/1993 Pham ..................... 331/117 R
5,502,420 A * 3/1996 Barclay ...................... 332/135
6,147,559 A * 11/2000 Fong ......................... 330/311

FOREIGN PATENT DOCUMENTS

JP            407221545 A * 8/1995

OTHER PUBLICATIONS

U.S. patent application Ser. No. 09/892,447, filed Jun. 28, 2001, pending.

* cited by examiner

*Primary Examiner*—Robert Pascal
*Assistant Examiner*—Joseph Chang
(74) *Attorney, Agent, or Firm*—Oblon, Spivak, McClelland, Maier & Neustadt, P.C.

(57) ABSTRACT

An oscillation circuit comprises first and second transistors and a load. The first transistor includes a base inputted an oscillation signal, an emitter connected to a ground potential, and a collector. The second transistor includes a collector connected to a power supply potential, a gate and an emitter. The load has one end connected to the collector of the first transistor, and the other end connected to the emitter of the second transistor, and causes a voltage drop proportional to the power supply potential. The voltage drop caused by the load reduces dependency of a base-collector voltage of the first transistor upon the power supply potential.

10 Claims, 4 Drawing Sheets

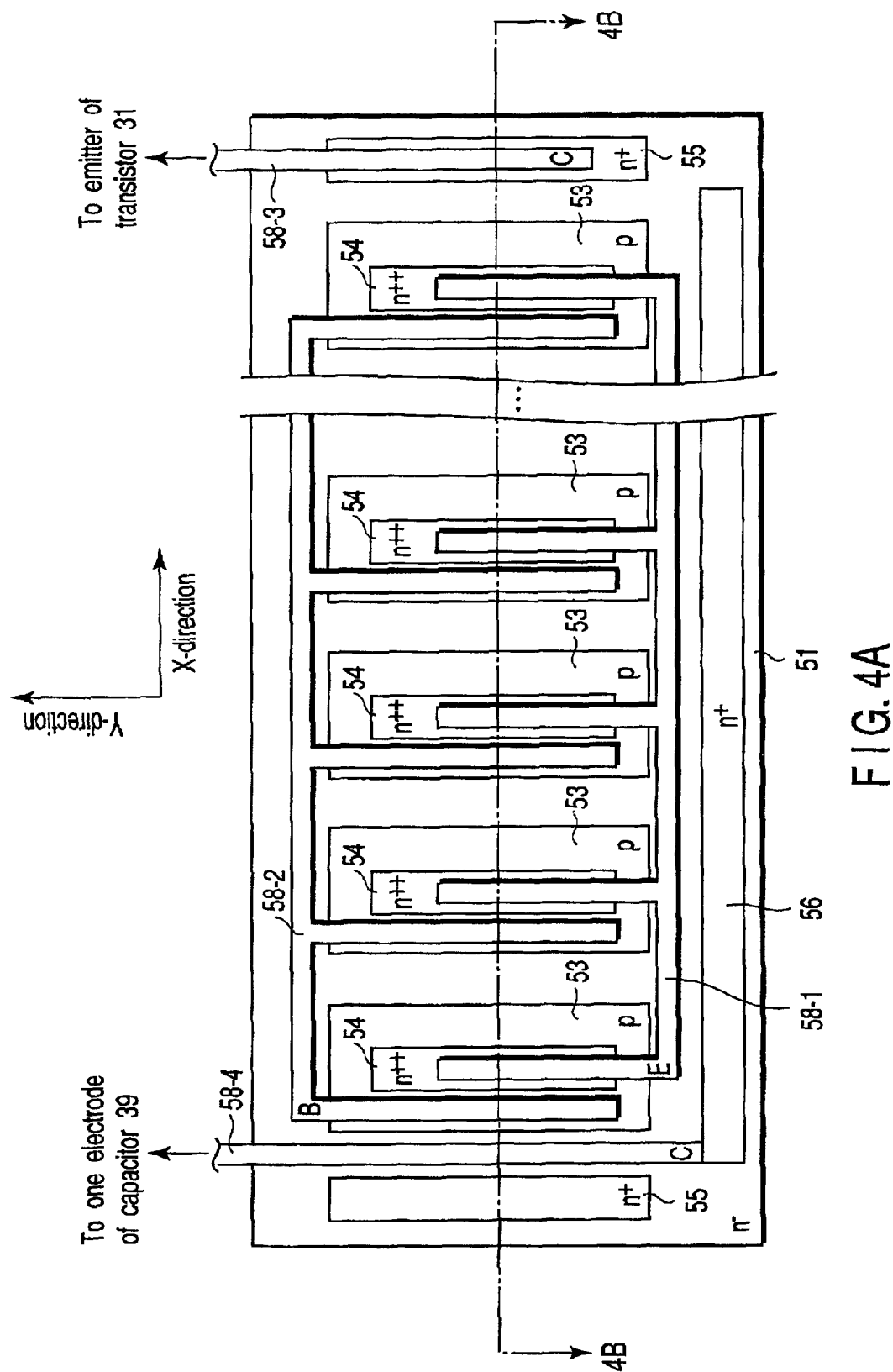

OSCILLATION CIRCUIT OF CASCODE CONNECTION TYPE

CROSS-REFERENCE TO RELATED APPLICATIONS

This application is based upon and claims the benefit of priority from the prior Japanese Patent Application No. 2000-399217 filed Dec. 27, 2000, the entire contents of which are incorporated by reference.

BACKGROUND OF THE INVENTION

1. Field of the Invention

The present invention relates to an oscillation circuit, and more particularly, to an oscillation circuit of a cascode connection type. Further, the invention relates to a technique for preventing a phenomenon in which the oscillation frequency of an oscillation circuit varies due to changes in power supply voltage.

2. Description of the Related Art

To construct an oscillation circuit for generating a high-frequency oscillation signal, a cascode connection is being widely used. The cascode connection is a connection method for connecting a grounded-emitter transistor circuit to a grounded-base transistor circuit in series. The cascode connection is characterized in that it can provide an oscillation circuit with both a total gain equivalent to that of the grounded-emitter transistor circuit and a bandwidth up to the cutoff frequency of the grounded-base transistor circuit. Accordingly, the cascode connection is very useful in constructing a high-frequency oscillation circuit.

FIG. 1 is a circuit diagram illustrating a conventional grounded-collector oscillation circuit 10 of a cascode connection type. As shown, the oscillation circuit 10 comprises two bipolar transistors 11 and 12, bias resistance elements 13–15, a resistance element 16, a load 17, a capacitance element 18 and an LC oscillator section 19.

The transistor 11 includes a base connected to respective ends of the bias resistance elements 13 and 14, a collector connected to an end of the load 17, and an emitter connected to the collector of the transistor 12. The transistor 12 includes a base connected to the other end of the bias resistance element 14, an end of the bias resistor 15 and the output terminal of the LC oscillator section 19, a collector connected to one electrode of the capacitance element 18, and an emitter connected to an end of the resistance element 16. The other ends of the bias resistance element 13 and the load 17 are connected to a power supply potential Vcc. The other ends of the bias resistance element 15 and the resistance element 16, and the other electrode of the capacitance element 18 are connected to the ground potential. In other words, the grounded-base transistor 11 and the grounded-emitter transistor 12 are connected in series. A capacitance element 20 interposed between the base and collector of the transistor 12 is a parasitic capacitance element. The capacitance element 20 is created because of a depletion layer which occurs in a pn-junction between the base region and collector region of the transistor 12. Therefore, the capacitance Cbc of the capacitance element 20 depends upon the width of the depletion layer. The width of the depletion layer depends upon the base-collector voltage Vbc of the transistor 12.

In the oscillation circuit constructed as above, the difference in potential between the bases of the transistors 11 and 12 (a voltage drop occurring at the bias resistance element 14) is (R2·Vcc)/(R1+R2+R3) (R1·R3: the respective resistances of the bias resistance elements 13–15). Thus, the potential difference is directly determined from the resistances of the bias resistance elements 13–15. Accordingly, the base-collector voltage Vbc of the transistor 12 is ((R2·Vcc)/(R1+R2+R3)−Vbe). Vbe represents the base-emitter voltage of the transistor 11, which is substantially constant. As is evident from the above equation, a change in the power supply potential Vcc causes a change in the base-collector voltage Vbc of the transistor 12.

Moreover, as aforementioned, the depletion layer width that determines the capacitance Cbc of the capacitance element 20 depends upon the base-collector voltage Vbc of the transistor 12. Further, the base-collector voltage Vbc depends upon the power supply potential Vcc. Consequently, the capacitance Cbc depends upon the power supply potential Vcc, which means that a change in the power supply potential Vcc causes a change in the capacitance Cbc.

The oscillation frequency fosc of an oscillation signal output from the oscillation circuit 10 is basically determined from an oscillation signal output by the LC oscillator section 19. However, the oscillation frequency is, of course, influenced by the capacitance Cbc of the capacitance element 20. This being so, a change in the power supply potential Vcc causes a change in the base-collector voltage Vbc of the transistor 12, which causes a change in the capacitance Cbc of the capacitance element 20 and hence a change in the oscillation frequency fosc of the oscillation circuit 10.

As described above, a phenomenon in which power supply potential Vcc fluctuation causes oscillation frequency fosc fluctuation (this phenomenon is called "pushing") occurs in the conventional cascode-connection-type oscillation circuit.

BRIEF SUMMARY OF THE INVENTION

An oscillation circuit according to an aspect of the present invention comprises:
  a first transistor including a base inputted an oscillation signal, an emitter connected to a ground potential, and a collector;
  a second transistor including a collector connected to a power supply potential, a base and an emitter; and
  a first resistance element having one end connected to the collector of the first transistor, and another end connected to the emitter of the second transistor, the first resistance element causing a voltage drop proportional to the power supply potential,
  wherein the a resistance of the first resistance element is set such that a change in a potential appearing across the first resistance element is equal to a change in a potential difference between the bases of the first and second transistors when the power supply potential changes.

BRIEF DESCRIPTION OF THE SEVERAL VIEWS OF THE DRAWING

FIG. 4A is a plan view illustrating a portion of an oscillation circuit according to a second embodiment of the invention;

DETAILED DESCRIPTION OF THE INVENTION

Figure 1:
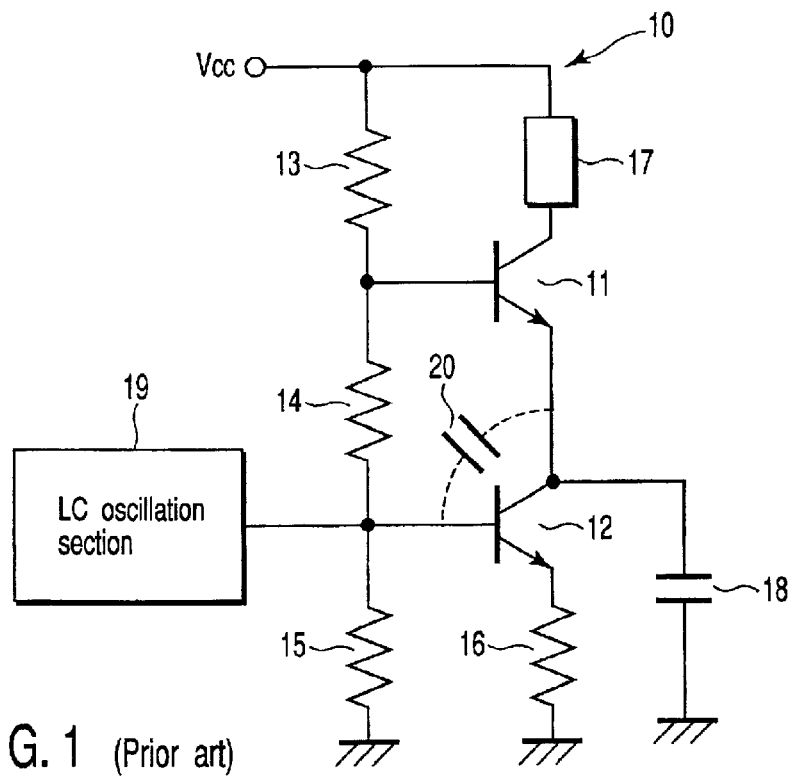
FIG. 1 is a circuit diagram illustrating a conventional oscillation circuit.
Figure 2:
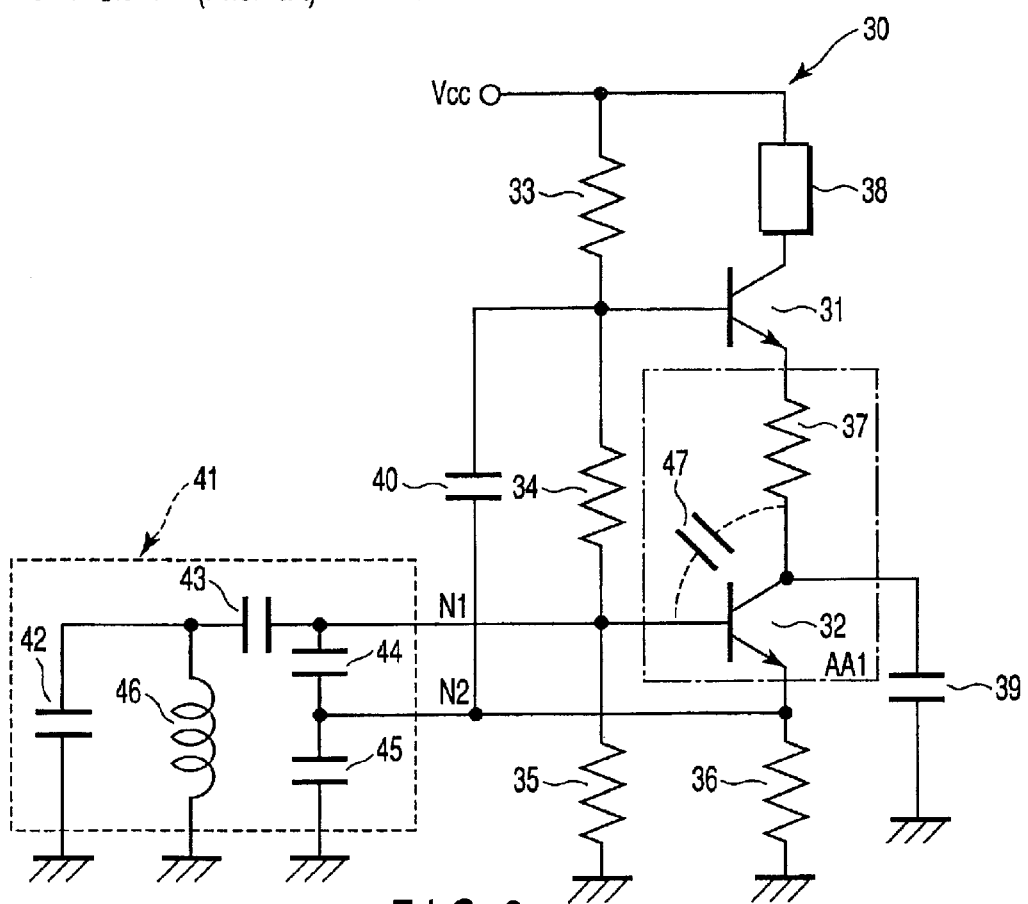
FIG. 2 is a circuit diagram illustrating an oscillation circuit according to a first embodiment of the invention.

FIG. 2 is a circuit diagram illustrating an oscillation circuit according to a first embodiment of the invention. This circuit is a grounded-collector oscillation circuit of a cascode connection type.

As shown in FIG. 2, an oscillation circuit 30 comprises a bipolar transistor 31 (a second transistor), a bipolar transistor 32 (a first transistor), bias resistance elements 33 and 35, a bias resistance element 340, a resistance element 36, a load 37 (a load, load means), a load 38, a capacitance element 39 and an LC oscillator section 41 (an oscillator section).

The transistor 31 includes a base connected to respective ends of the bias resistance elements 33 and 34, a collector connected to an end of the load 38, and an emitter connected to an end of the load 37. The transistor 32 includes a base connected to the other end of the bias resistance element 34, an end of the bias resistor 35 and the node N1 of the LC oscillator section 41, a collector connected to the other end of the load 37 and one electrode of the capacitance element 39, and an emitter connected to an end of the resistance element 36 and the node N2 of the LC oscillator section 41. In this embodiment, the load 37 is a resistance element. The other ends of the bias resistance element 33 and the load 38 are connected to a power supply potential Vcc. The other ends of the bias resistance element 35 and the resistance element 36, and the other electrode of the capacitance element 39 are connected to the ground potential. Further, a capacitance element 40 is interposed between the base of the transistor 31 and the node N1 of the LC oscillator section 41. Thus, the grounded-base transistor 31 and the grounded-emitter transistor 32 are connected in series. The resistance Rc of the load (resistance element) 37 is set at a value given by the following equation:

$$Rc = R2 \cdot R4/R3$$

where R2 and R3 represent the resistances of the bias resistance elements 34 and 35, respectively, and R4 the resistance of the resistance element 36.

The LC oscillator section 41 incorporates capacitance elements 42–45 and an inductor 46. One electrode of the capacitance element 42 is connected to an end of the inductor 46 and one electrode of the capacitance element 43. The other electrode of the capacitance element 43 is connected to one electrode of the capacitance element 44. The other electrode of the capacitance element 44 is connected to one electrode of the capacitance element 45. Furthermore, the other electrodes of the capacitance elements 42 and 45 and the other end of the inductor 46 are connected to the ground potential. The connection node between the other electrode of the capacitance element 43 and the one electrode of the capacitance element 44 is the node N1 that is connected to the base of the transistor 32. The connection node between the other electrode of the capacitance element 44 and the one electrode of the capacitance element 45 is the node N2 that is connected to the emitter of the transistor 32.

A capacitance element 47 interposed between the base and collector of the transistor 32 is a parasitic capacitance element, which is created because of a depletion layer which occurs in a pn-junction between the base region and collector region of the transistor 32. Therefore, the capacitance Cbc of the capacitance element 47 depends upon the width of the depletion layer. The width of the depletion layer depends upon the base-collector voltage Vbc of the transistor 32.

The oscillation circuit constructed as above can eliminate the main cause of the conventional pushing phenomenon, in which a change in the power supply potential Vcc causes a change in the base-collector voltage Vbc. As a result, the oscillation frequency fosc is independent of the power supply potential Vcc, and the oscillation circuit can supply an oscillation signal of a stable frequency. This effect will now be described in detail.

In the oscillation circuit shown in FIG. 2, a current I1 flowing in the resistance element 37 is approximated by the following equation:

$$I1 = (R3 \cdot Vcc/(R1+R2+R3) - Vbe)/R4$$

where R1–R3 represent the resistances of the bias resistance elements 33–35, respectively, R4 the resistance of the resistance element 36, and Vbe the base-emitter voltage of the transistor 32 ($\approx$ the base-emitter voltage of the transistor 31).

Accordingly, a voltage drop V(R2) at the resistance element 34 is given by the following equation:

$$V(R2) = Vbe + I1 \cdot Rc + Vbc$$

where Rc represents the resistance of the resistance element 37.

From the above equations, the base-collector voltage Vbc of the transistor 32 is given by:

$$Vbc = (R2 - R3 \cdot Rc/R4) \, Vcc/(R1+R2+R3) - (1 - Rc/R4) - Vbe$$

Accordingly, the dependency coefficient k1 of Vbc upon Vcc is given by:

$$k1 = (R2 - R3 \cdot Rc/R4)/(R1+R2+R3)$$

In the oscillation circuit according to the embodiment, the resistance Rc of the resistance element 37 is set at:

$$Rc = R2 \cdot R4/R3$$

As is understood from the assignment of the resultant value of Rc to the equation for the dependency coefficient, the dependency coefficient k1=0. This means that Vbc does not depend upon Vcc. In this case, the base-collector voltage Vbc of the transistor 32 is given by:

$$Vbc = (Rc/R4 - 1) \cdot Vbe = (R2/R3 - 1) \cdot Vbe$$

Thus, the base-collector voltage Vbc of the transistor 32 is independent of the power supply potential Vcc. The capacitance Cbc of the parasitic capacitance element 47 is accordingly independent of the power supply potential Vcc. As a result, the oscillation frequency fosc is unaffected by changes (pushing) in the power supply potential Vcc.

Figure 3:
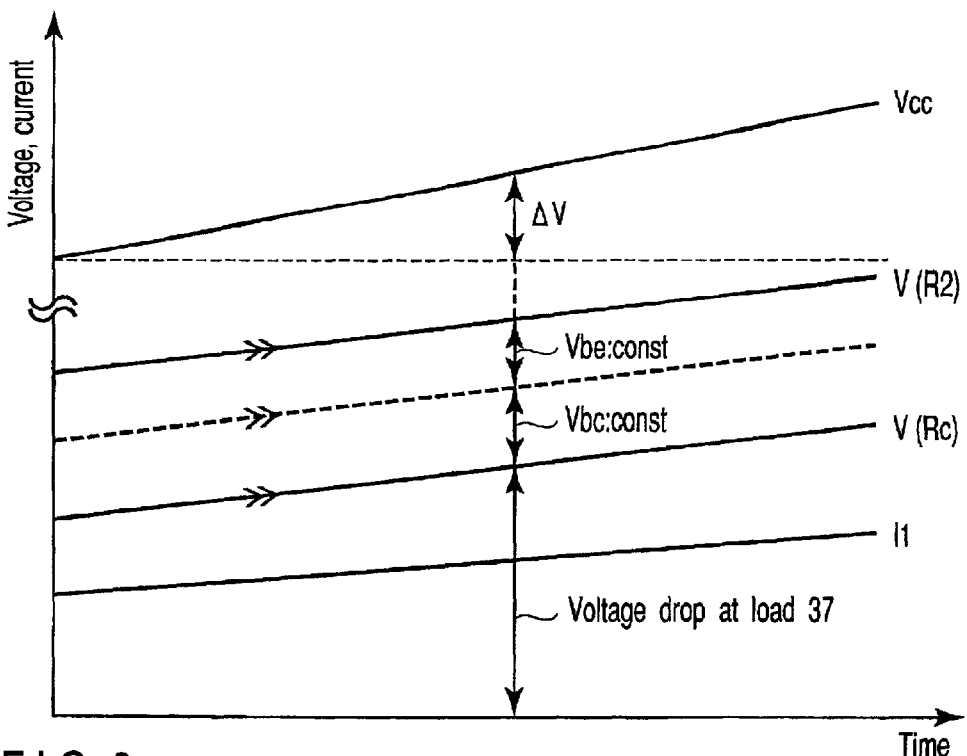
FIG. 3 is a graph illustrating the relationship between changes in voltage/current and changes in power supply potential.

Qualitative reasoning will be given of the above explanation, referring to FIG. 3. FIG. 3 is a view illustrating changes with time in the power supply potential Vcc, a voltage drop V(R2) at the resistance element 34, a voltage drop V(Rc) at the resistance element 37, and the current I1 flowing through the resistance element 37. Naturally, suppose that the resistance Rc of the resistance element 37 is set at R2·R4/R3. Further, each voltage is set with reference to the potential at the connection node of the bias resistance elements 34 and 35 (i.e. the base potential of the transistor 32).

As shown in FIG. 3, as the power supply potential Vcc increases with time, the voltage V(R2) that occurs at the resistance element 34 increases proportionally. If there is no resistance element 37 as in the conventional case, V(R2)= Vbe+Vbc. Since Vbe is substantially constant, Vbc is directly influenced by an increase in Vcc. However, in the embodiment that employs the resistance element 37, V(R2)= Vbe+V(Rc)+Vbc (Vbe: constant). In other words, a potential difference of (V(R2)−Vbe) is divided into Vbc and V(Rc). At this time, if the resistance Rc of the resistance element 37 is set at R2·R4/R3, changes in the voltage V(Rc) that occurs at the resistance element 37 are equal to changes in V(R2) as shown in FIG. 3. Accordingly, the lines indicative of changes with time in V(R2) and V(Rc) are parallel to each other. This means that the difference between V(R2) and V(Rc) is constant even if the power supply potential Vcc changes, and that this constant potential difference is divided into Vbe and Vbc. Since Vbe is substantially constant as aforementioned, Vbc is also constant, and is independent of the power supply potential Vcc.

The above explanation can be paraphrased as follows. In the conventional oscillation circuit with no resistance element 37, the potential at the connection node of the emitter of the transistor 31 and the collector of the transistor 32 is directly determined by the resistances R1–R3 of the bias resistance elements 33–35 and the power supply potential Vcc. On the other hand, in the configuration of the embodiment, the resistance element 37 is provided between the emitter of the transistor 31 and the collector of the transistor 32. This implies that the factors determining the collector potential of the transistor 32 include a factor depending upon a current. In other words, the potential difference between the emitter of the transistor 31 and the base of the transistor 32 is determined by the resistances R1–R3 of the bias resistance elements 33–35, the power supply potential Vcc and the base-emitter voltage Vbe. The thus-determined potential difference is divided into the voltage V(Rc) and the base-collector voltage Vbc of the transistor 32. The voltage V(Rc) naturally depends upon the current I1, which changes in accordance with changes in the power supply potential Vcc. Accordingly, if the power supply potential Vcc increases, the current I1 also increases, thereby increasing the ratio of the V(Rc) to the potential difference of the emitter of the transistor 31 and the base of the transistor 32. As a result, the increase of the collector potential of the transistor 32 is suppressed. On the other hand, if the power supply potential Vcc decreases, the current I1 also decreases, thereby decreasing the ratio of the voltage drop at the resistance element 37 to the potential difference of the emitter of the transistor 31 and the base of the transistor 32. As a result, the reduction of the collector potential of the transistor 32 is suppressed. Thus, in the conventional case, Vbc changes due to changes in the power supply potential Vcc, whereas in the oscillation circuit according to the embodiment, the voltage drop at the resistance element 37 changes when the power supply potential Vcc changes, thereby suppressing changes in Vbc. In other words, negative feedback with respect to the power supply potential Vcc occurs in the collector potential of the transistor 32.

As described above, in the cascode-connection-type oscillation circuit of the embodiment, the resistance element 37 having an appropriate resistance is interposed between the emitter of the grounded-base transistor 31 and the collector of the grounded-emitter transistor 32. This configuration enables the base-collector voltage Vbc of the grounded-emitter transistor 32 to be independent of the power supply potential Vcc. Accordingly, the capacitance Cbc of the parasitic capacitance element that parasitically exists between the base and collector of the transistor 32 is independent of the power supply potential Vcc. This enables the oscillation frequency fosc of an oscillation signal output from the oscillation circuit to be stabilized without being influenced by changes in the power supply voltage Vcc.

Figure 4B:
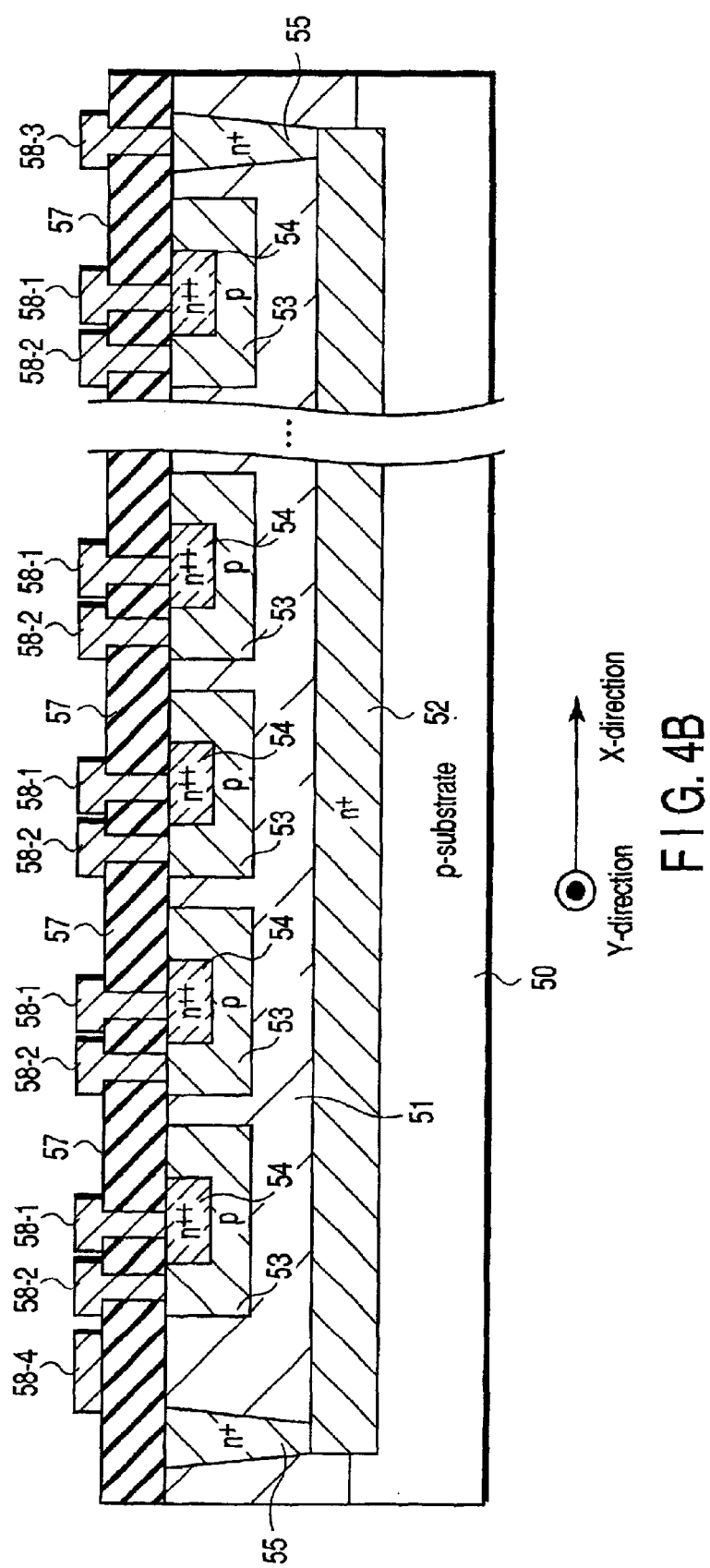
FIG. 4B is a view taken along line 4B—4B of FIG. 4A.

Referring then to FIGS. 2, 4A and 4B, an oscillation circuit according to a second embodiment of the invention will be described. This embodiment is directed to a method for realizing the resistance element 37 employed in the first embodiment. FIG. 4A is a plan view illustrating a portion (corresponding to an area AA1 in FIG. 2) of the oscillation circuit of the second embodiment, and FIG. 4B is a cross sectional view taken along line 4B—4B in FIG. 4A. In this embodiment, a description will be given of the transistor 32 and the resistance element 37 shown in FIG. 2.

As shown, an $n^-$-type epitaxial silicon layer 51 of a low impurity density is provided on a p-type silicon substrate 50. An $n^+$-type buried layer 52 of a high impurity density is provided at an interface between the silicon substrate 50 and the epitaxial silicon layer 51. The epitaxial silicon layer 51 and the buried layer 52 function as the collector area of the transistor 32. A plurality of Y-directionally-extending p-type diffusion layers 53 are provided in stripes in surface portions of the epitaxial silicon layer 51, and function as the base areas of the transistor 32. Further, an $n^{++}$-type diffusion layer 54 of a high impurity density, which functions as an emitter area, is provided in a surface portion of each of the base areas 53. Therefore, as shown in FIG. 4A, the planar pattern of the transistor 32 includes the base areas 53 existing like islands in the collector area 51, and the emitter areas 54 similarly existing like islands in the respective base areas 53. The base areas 53 are arranged at regular intervals in the X-direction perpendicular to the Y-direction.

A pair of Y-directionally-extending $n^+$-type slim diffusion layers 55 (first leading areas) are provided in the silicon layer 51, such that they extend from the surface of the silicon layer 51 to the respective X-directionally opposite ends of the buried layer 52. In other words, the base areas 53 are interposed between the diffusion layers 55 in the X-direction. Further, an X-directionally-extending $n^+$-type slim diffusion layer 56 (a second leading area) is provided in the silicon layer 51, such that it extends from the surface of the silicon layer 51 to a Y-directional end of the buried layer 52.

Furthermore, an interlayer insulating film 57 is provided on the silicon layer 51, and metal wiring layers 58-1–58-4 are provided on the interlayer insulating film 57. The metal wiring layers 58-1 and 58-2 are connected to the emitter areas 54 and the base areas 53, respectively, via contact holes. The metal wiring layer 58-3 is connected to one of the diffusion layers 55 via a contact hole. The metal wiring layer 58-3 electrically connects the emitter areas of the transistor 31 to the collector areas 51 and 52 of the transistor 32. Moreover, the metal wiring layer 58-4 is connected to the diffusion layer 56 via a contact hole. The metal wiring layer 58-4 electrically connects the collector areas 51 and 52 of the transistor 32 to one electrode of the capacitance element 39.

In the bipolar transistor constructed as above, a plurality of base areas 53 are connected in parallel, and hence the base resistance can be reduced. This enables the occurrence of white noise proportional to the base resistance to be suppressed, and an oscillation signal output by the oscillation circuit to be more accurate. In addition, in the transistor 32 constructed as above, a DC component included in a current, which flows from the emitter of the transistor 31 to the collector of the transistor 32, flows from the diffusion layers 55 to the emitter areas 54 via the buried layer 52. On the other hand, an AC component included in the current flows from the diffusion layers 55 to the diffusion layer 56 via the buried layer 52. Accordingly, the n$^+$-type diffusion layer 52 can be used not only as the collector area but also as the resistance element 37. The above-described advantage of the first embodiment can be obtained by controlling the impurity density and volume of the n$^+$-type diffusion layer 52 so as to set the resistance Rc of the layer 52 at R2·R4/R3.

In the cascode-connection type oscillation circuit according to the first and second embodiments, the load 37 is provided between the emitter of the grounded-base transistor 31 and the collector of the grounded-emitter transistor 32, and is set to an appropriate resistance. In this configuration, when the potential difference between the emitter and the collector has changed due to a change in the power supply potential Vcc, a voltage drop corresponding to a change in the potential difference occurs only at the load 37. Thus, the base-collector voltage Vbc of the transistor 32 is independent of the power supply potential Vcc, thereby preventing the occurrence of pushing.

Figure 5:
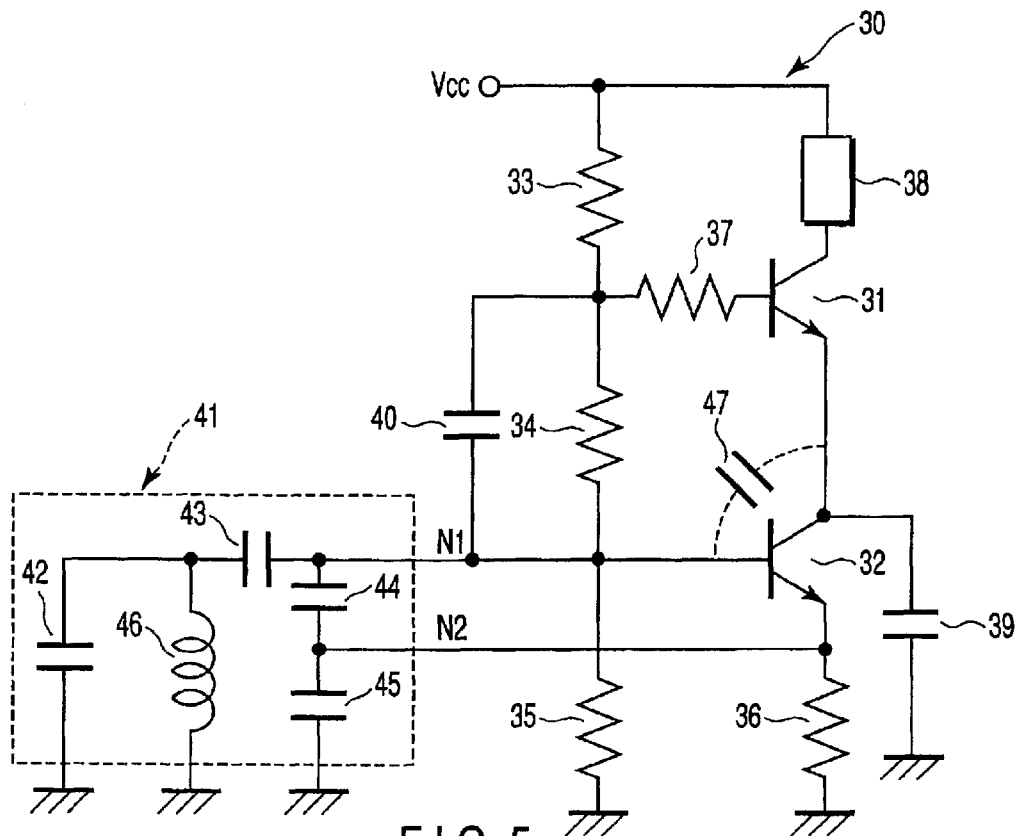
FIG. 5 is a circuit diagram illustrating a modification of the first and second embodiments.

In the above embodiments, the load 37 is provided between the emitter of the grounded-base transistor 31 and the collector of the grounded-emitter transistor 32. However, the load 37 may be provided at the base of a grounded-base transistor, as is shown in FIG. 5. In this case, it is necessary to set the resistance Rc of the load 37 to 1/hfe of the resistance set when the load is provided between the emitter and the collector ("hfe" represents the current gain of the grounded-emitter transistor 31). Specifically, when the power supply potential Vcc has changed, the voltage drop at the resistance element 34 changes. At this time, if the load 37 is provided in a portion of a current path formed by the base and emitter of the transistor 31 and the collector and base of the transistor 32, and a voltage drop corresponding to a change in the voltage drop at the resistance element 34 is caused to occur only at the load 37, the base-collector voltage Vbc of the transistor 32 can be maintained a constant.

Although the above embodiments are directed to a grounded-collector oscillation circuit using npn-type bipolar transistors, pnp-type bipolar transistors may be used instead. Further, the embodiment of the invention is not limited to the grounded-collector oscillation circuit. Furthermore, the embodiment of the invention is not limited to an oscillation circuit using only bipolar transistors, but is also applicable to cascode-connection type oscillation circuit which employs both bipolar and MOS transistors.

The resistance Rc of the resistance element 37 is not limited to a value that enables the dependency of the base-collector voltage Vbc of the transistor 32 upon the power supply potential to be completely eliminated. It is sufficient if the resistance may be set to a value that enables the dependency of Vbc upon the power supply potential to be suppressed to a range in which no problem occurs in the practical use.

Also, the oscillation circuit in the embodiments is not limited to the above-described configuration. For example, the bias resistance elements 33–35 may be replaced with, for example, a current source, a voltage source and resistors, and a circuit formed thereof. The load 37 is not limited to a standard resistance element, but may be any resistance means if it has a function as a resistor. For example, it may be a parasitic resistor such as a metal wire having a desired resistance.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An oscillation circuit comprising:
    a first transistor including a base inputted an oscillation signal, an emitter connected to a ground potential, and a collector;
    a second transistor including a collector connected to a power supply potential, a base and an emitter; and
        first resistance element having one end connected to the collector of the first transistor, and another end connected to the emitter of the second transistor, the first resistance element causing a voltage drop proportional to the power supply potential,
    wherein a resistance of the first resistance element is set such that a change in a potential appearing across the first resistance element is equal to a change in a potential difference between the bases of the first and second transistors when the power supply potential changes.

2. The oscillation circuit according in claim 1, wherein the voltage drop caused by the first resistance element changes in accordance with a change in the power supply potential, thereby causing negative feedback to the base-collector voltage of the first transistor.

3. The oscillation circuit according to claim 1, wherein only the voltage drop caused by the first resistance element depends upon a change in the power supply potential in a current path extending from The base of the second transistor to the base of the first transistor via the first resistance element.

4. The oscillation circuit according to claim 1, further comprising:
    an oscillation section which outputs the oscillation signal of a constant oscillation frequency; and
    a resistance element provided between the base of the first and second transistor, a change in a voltage drop at the resistance element, which occurs when the power supply potential has changed, being substantially equal to a change in the voltage drop at the first resistance element.

5. The oscillation circuit according to claim 1, wherein the first resistance element is a resistance element.

6. The oscillation circuit according to claim 1, further comprising a capacitance element having an electrode connected to the collector of the first transistor, and another electrode connected to the ground potential.

7. The oscillation circuit according to claim 1, wherein the first transistor includes:
    a first-conductivity-type first collector area, at least a portion of the first collector area functioning the first resistance element;
    a first-conductivity-type second collector area provided on a surface of the first collector area and having a lower impurity density than the first collector area;
    a second-conductivity-type area provided in a surface of the second collector area;
    a first-conductivity-type emitter area provided in a surface of the base area; and
    a first-conductivity-type leading area extending from a surface of the second collector area to the first collector area, the first collector area being connected to the emitter of the second transistor via the first leading area.

8. The oscillation circuit according to claim 7, further comprising:
a capacitance element having one electrode connected to the collector of the first transistor, and another electrode connected to the ground potential; and
a first-conductivity-type second leading area extending from a surface of the second collector area to the first collector area, the first collector area being connected to the one electrode of the capacitance element via the second leading areas.

9. The oscillation circuit according to claim 7, wherein the base area is divided into a plurality of base area parts arranged in parallel in the surface of the second collector area, the base area parts having a planar pattern in which the base area parts are arranged in stripes, the base area parts being electrically connected to each other.

10. The oscillation circuit according to claim 1, further comprising:
a second resistance element having one and connected to the base of the second transistor, and another end connected to the base of the first transistor;
a third resistance element having one and connected to the base of the first transistor, and another end connected to the ground potential; and
a fourth resistance element connected between the emitter of the first transistor and the ground potential,
wherein the resistance R1 of the first resistance element is set at:

$$R1 = R2 \cdot R4 / R3$$

where R2 to R4 represent the resistance of the second to fourth resistance elements, respectively.

* * * * *